(12) United States Patent
Yang et al.

(10) Patent No.: US 7,583,126 B2
(45) Date of Patent: Sep. 1, 2009

(54) APPARATUS AND METHOD FOR PREVENTING CURRENT LEAKAGE WHEN A LOW VOLTAGE DOMAIN IS POWERED DOWN

(75) Inventors: Ge Yang, Pleasanton, CA (US); Hwong-Kwo Lin, Palo Alto, CA (US); Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/753,501

(22) Filed: May 24, 2007

(65) Prior Publication Data

US 2008/0290935 A1    Nov. 27, 2008

(51) Int. Cl.
*H03L 5/00* (2006.01)
(52) U.S. Cl. ....................................... 327/333
(58) Field of Classification Search ............ 327/333
See application file for complete search history.

(56) References Cited

U.S. PATENT DOCUMENTS

| | | | | |
|---|---|---|---|---|
| 5,444,396 A * | 8/1995 | Soneda | ....................... | 326/81 |
| 6,310,492 B1 * | 10/2001 | Ikoma et al. | ................... | 326/81 |
| 6,373,285 B1 * | 4/2002 | Konishi | ....................... | 326/81 |
| 6,559,704 B1 * | 5/2003 | Golliher et al. | ............. | 327/333 |
| 6,667,648 B2 * | 12/2003 | Stout et al. | ................... | 327/333 |
| 6,714,047 B2 * | 3/2004 | Shimizu et al. | ............... | 326/62 |
| 6,774,696 B2 * | 8/2004 | Clark et al. | ................. | 327/333 |
| 6,861,873 B2 * | 3/2005 | Correale, Jr. | ................. | 326/81 |
| 6,888,395 B2 * | 5/2005 | Mizuno et al. | .............. | 327/333 |
| 6,963,231 B2 * | 11/2005 | Yang | .......................... | 327/112 |
| 7,005,908 B2 * | 2/2006 | Lee et al. | ..................... | 327/333 |
| 7,176,741 B2 * | 2/2007 | Ishikawa et al. | ............ | 327/333 |
| 2007/0018710 A1 * | 1/2007 | Choi et al. | ................... | 327/333 |

OTHER PUBLICATIONS

U.S. Appl. No. 11/559,155, filed Nov. 13, 2006.

\* cited by examiner

*Primary Examiner*—Lincoln Donovan
*Assistant Examiner*—William Hernandez
(74) *Attorney, Agent, or Firm*—Zilka-Kotab, PC

(57) ABSTRACT

An apparatus and method are provided for preventing a current leakage or direct current when a low voltage domain is powered down. Included is a voltage transition circuit connected between a low voltage domain and a high voltage domain. Such voltage transition circuit includes a circuit component for preventing a current leakage when the low voltage domain is powered down.

18 Claims, 15 Drawing Sheets

APPARATUS AND METHOD FOR PREVENTING CURRENT LEAKAGE WHEN A LOW VOLTAGE DOMAIN IS POWERED DOWN

FIELD OF THE INVENTION

The present invention relates to voltage transition circuits, and more particularly to voltage transition circuits adapted for power savings.

BACKGROUND

The need to reduce on-chip power consumption has continued to increase as the number of transistors within chips (e.g. microprocessors, graphics chips) increases and as electronic devices that use these chips are scaled down, for example, for greater mobility. Historically, the low power consumption targets of chips have been achieved by aggressively scaling down their power supply voltages.

In an effort to further reduce overall power consumption, many chip designs also include two or more different power supply domains. Non-critical blocks within a chip, for example, can be designed to consume minimal amounts of energy by tying them to lower power supply voltages in a low power supply domain. Within the same chip, timing critical blocks that require the stability associated with a high power domain can be designed to use higher power supply voltages. Often, voltage level shifters are used to convert voltages in the high power supply domain to voltages in the low power supply domain, and visa versa.

FIG. 1 shows a level shifter 100 in the form of a buffer, in accordance with the prior art. As shown, an input signal is received from a high voltage domain (e.g. VDDH domain) and an output signal is directed to a low voltage domain (e.g. VDDL domain). When the input signal is 0 (see state 102), transistors P1 and N2 are activated, and transistors N1 and P2 are deactivated. On the other hand, when the input signal is VDDH (see state 104), the transistors N1 and P2 are activated and the transistors P1 and N2 are deactivated. To this end, the illustrated buffer is capable of serving as a level shifter for converting a signal from the VDDH domain to the VDDL domain.

FIG. 2 shows a level shifter 200 in the form of a buffer that is adapted for converting an input signal from a VDDL domain to a VDDH domain, in accordance with the prior art. Similar to the level shifter 100 of FIG. 1, when the input signal is 0 (see state 202), transistors P1 and N2 are activated, and transistors N1 and P2 are deactivated. Further, when the input signal is VDDL (see state 104), the transistors N1 and P2 are activated and the transistor N2 is deactivated.

However, transistor P1 is partially activated or fully activated, depending on a value of VDDH, VDDL, and a device threshold voltage (Vth). In one example, VDDL=0.8V±10% VDDH=1V±10%, and Vth=200 mV-350 mV. In such case, a worst case involves a situation where VDDL=0.72V, VDDH=1.1V, and Vth=200 mV. For the transistor P1, the source voltage is 1.1V and the gate voltage is 0.72V, with the difference being 380 mV, which is larger than the threshold voltage 200 mV. Thus, in such situation, the transistor P1 is fully activated. Since the transistors P1 and N1 are fully activated, there is a DC current path 206 between VDDH and ground, which consumes a large amount of power.

FIG. 3 shows a buffer-type level shifter 300 adapted for avoiding a DC current flow when converting a signal from a VDDL domain to a VDDH domain, in accordance with the prior art. As shown, the level shifter 300 includes complimentary dual rail inputs IN and INB from the VDDL domain. When IN=VDDL and INB=0, transistors N2 and P1 are activated, contact point b=0, contact point a=VDDH, OUT=VDDH, and transistors N1 and P2 are deactivated. On the other hand, when IN=0 and INB=VDDL, the transistors N1 and P2 are activated, the transistors N2 and P1 are deactivated, contact point b=VDDH, contact point a=0, and OUT=0. By this design, no DC current flows through VDDH to ground.

However, such a design requires hundreds of signals from the VDDL domain to the VDDH domain. To this end, the dual rail inputs IN and INB require twice the number of signals to be routed. Unfortunately, such a design is thus cost-prohibitive.

FIG. 4 shows a single rail input level shifter 400 that addresses the problems with dual rail input level shifters (see, for example, FIG. 3), in accordance with the prior art. As shown, a single rail input is provided for increased power savings. More information regarding such single rail input level shifter 400 may be found with reference to a co-pending application filed Nov. 13, 2006 under application Ser. No. 11/559,155, which is incorporated herein by reference.

Unfortunately, none of the aforementioned level shifters accommodate situations where the VDDL domain is powered down for additional power savings purposes. Specifically, it often desired to power down the VDDL domain when its use is not required. To accomplish this power down, VDD may be cut off, such that any nodes internal to the VDDL domain are floating at an unknown value. As will be now set forth, some problems arise when attempting such VDDL domain power down.

FIG. 5 shows an inverter 500 that illustrates one problem with powering down a low voltage domain, in accordance with the prior art. During power down, the VDD is cut off, and all internal nodes float with an unknown value. If an input signal IN of the inverter 500 comes from a powered down block, the input signal IN may be any value. If IN=VDD/2, however, transistors P1 and N1 are activated, thus allowing a DC current 502 to flow through the transistors P1 and N1.

FIG. 6 shows a two input OR-gate 600 that addresses the problem with powering down a low voltage domain, in accordance with the prior art. As shown, a two input OR gate may be configured for power down control as well as avoiding DC current caused by floating input signals. An input signal IN is shown to be a floating input, and a power down signal PD is also provided. During a normal mode of operation, PD=0 and OUT=IN. In a power down mode, PD=VDD, and a PMOS transistor P2 is deactivated. Further, regardless as to what the input signal IN, OUT=VDD and there is no DC current flow.

To date, there is a continuing need to address such problems during a power down mode. For example, in the context of the level shifter 400 of FIG. 4, if a VDDL block is in the power down mode, VDDL_REF and an input signal IN can be any value between 0 and VDDL. Assume, in one example of operation, IN=VDDL/2 and VDDL_REF=VDDL. Since VDDH−Vthp>VDDL/2>Vthn, transistors P2, P3 and N2 are activated, and there is a DC current flowing through the transistors P2, P3 and N2. Further, contact point b is possibly around VDDH/2 and thus causes DC current flow through an associated output inverter.

SUMMARY

An apparatus and method are provided for preventing a current leakage or direct current when a low voltage domain is powered down. Included is a voltage transition circuit connected between a low voltage domain and a high voltage domain. Such voltage transition circuit includes a circuit component for preventing a current leakage when the low voltage domain is powered down.

DETAILED DESCRIPTION

Figure 1:
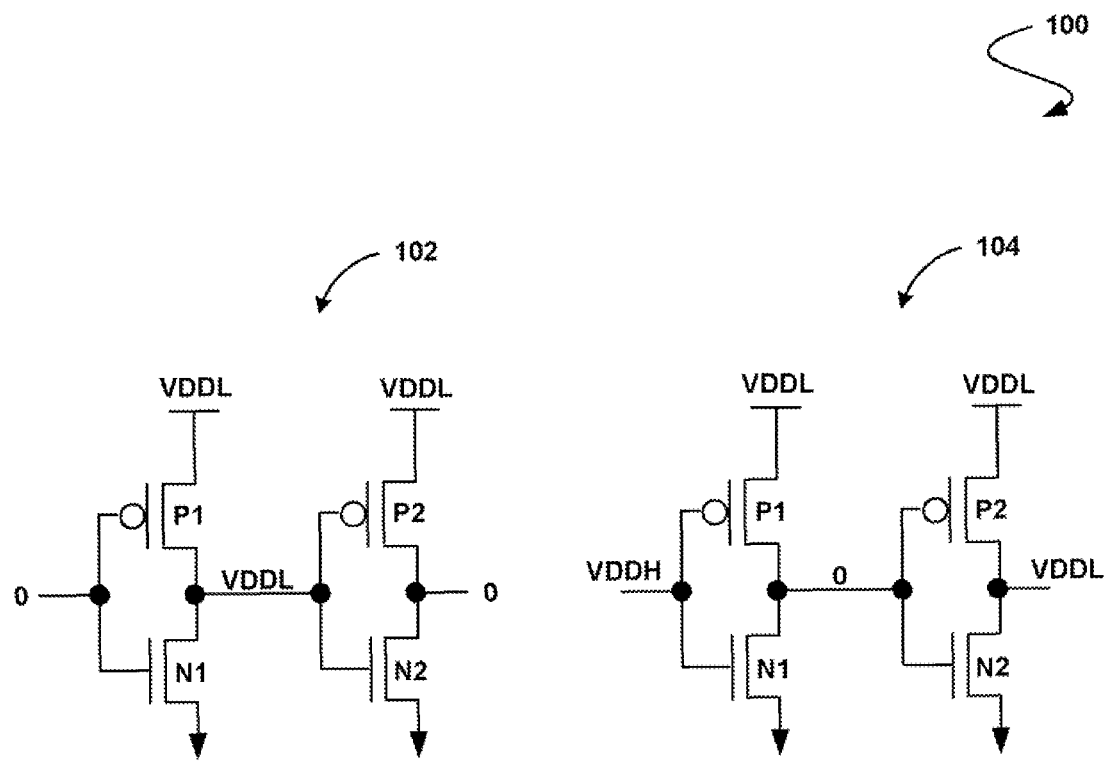
FIG. 1 shows a level shifter in the form of a buffer, in accordance with the prior art.
Figure 2:
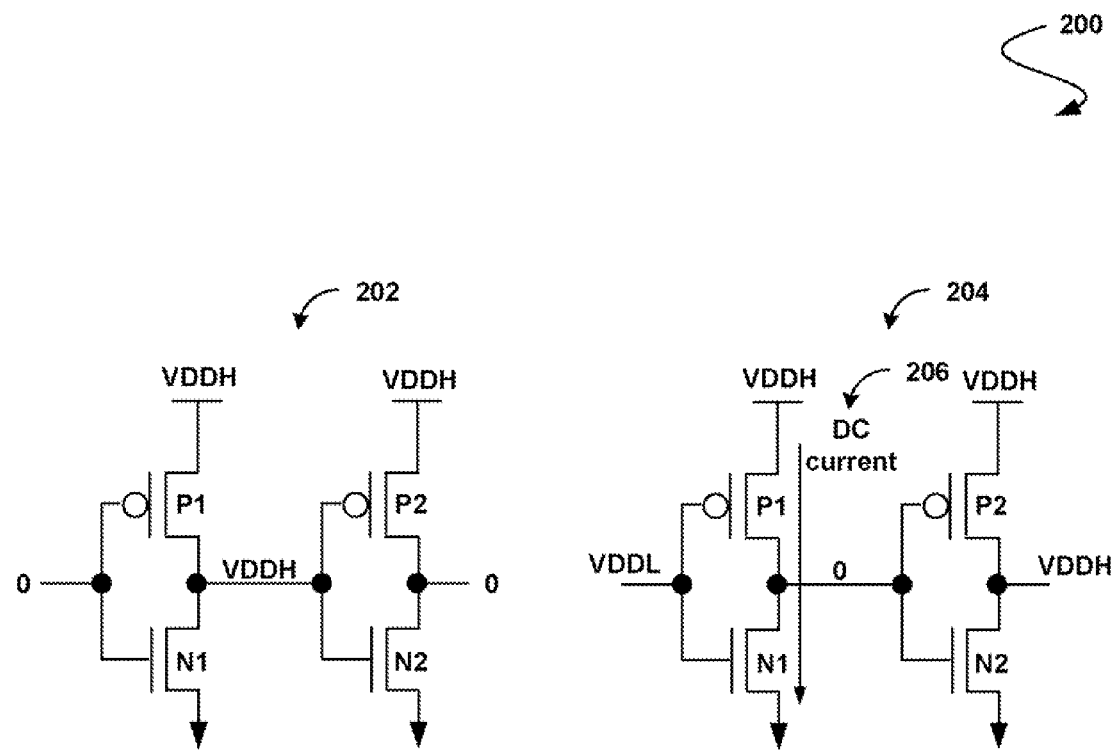
FIG. 2 shows a level shifter in the form of a buffer that is adapted for converting an input signal from a VDDL domain to a VDDH domain, in accordance with the prior art.
Figure 3:
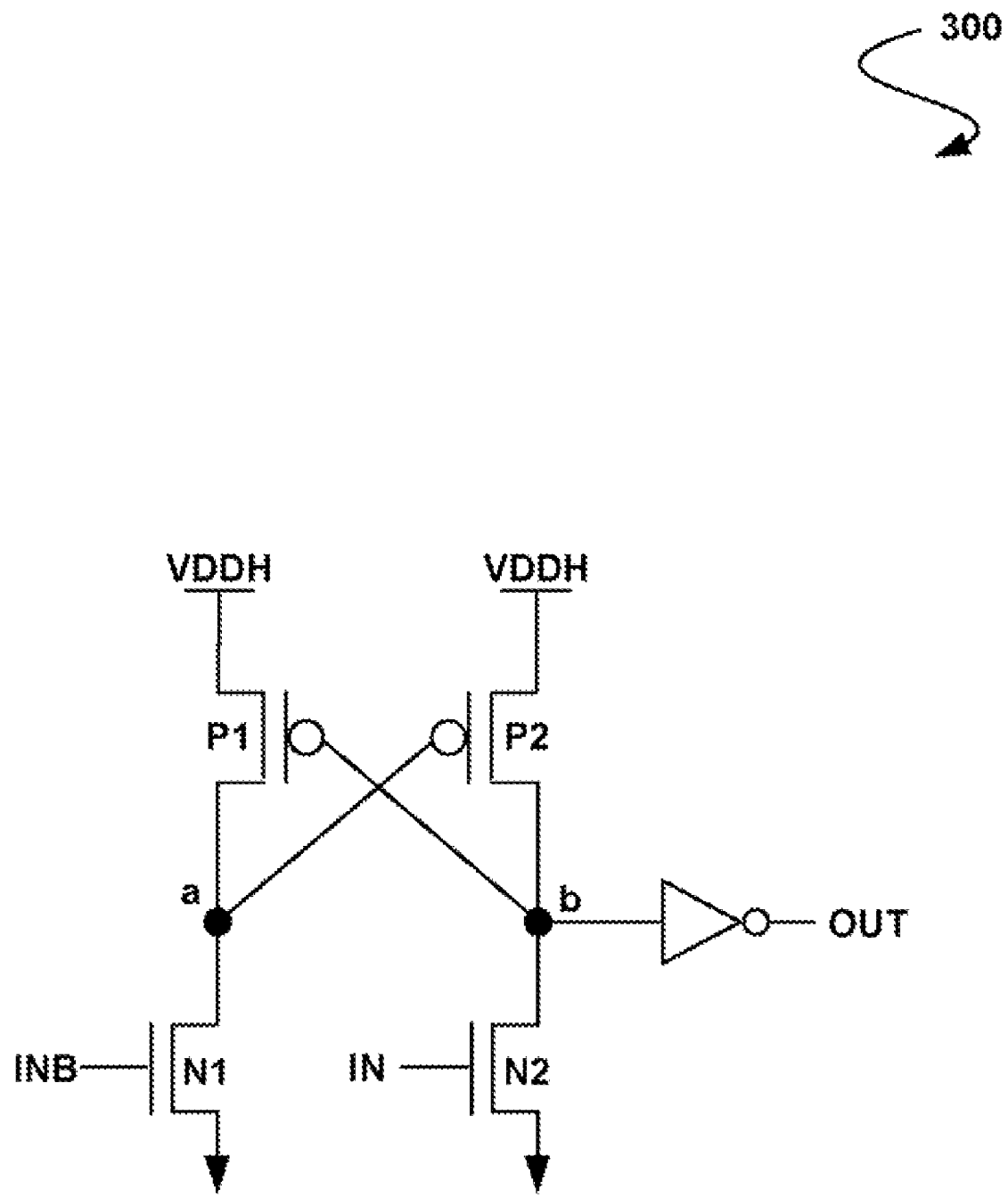
FIG. 3 shows a buffer-type level shifter adapted for avoiding a DC current flow when converting a signal from a VDDL domain to a VDDH domain, in accordance with the prior art.
Figure 4:
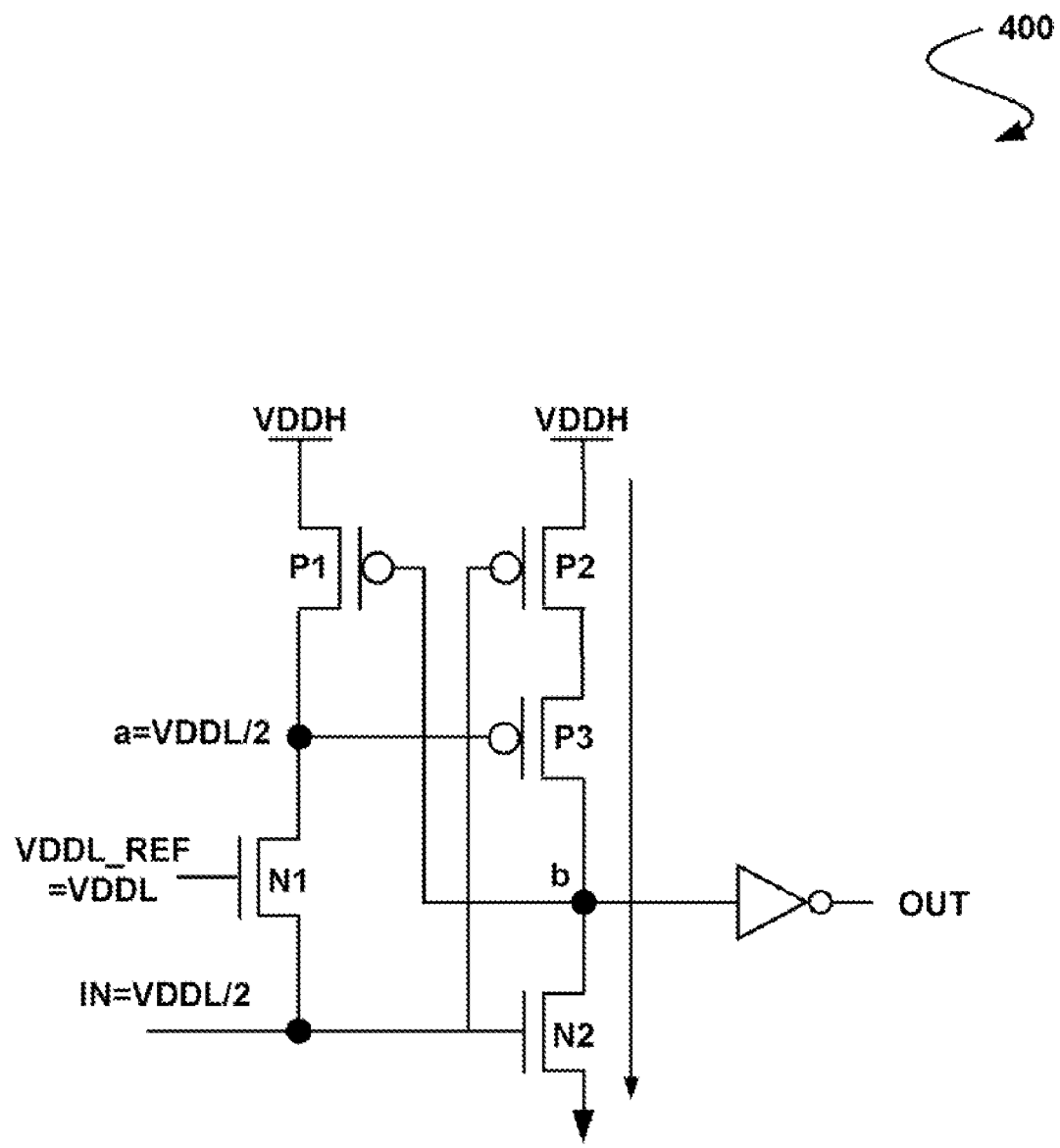
FIG. 4 shows a single rail input level shifter that addresses the problems with dual rail input level shifters (see, for example, FIG. 3), in accordance with the prior art.
Figure 5:
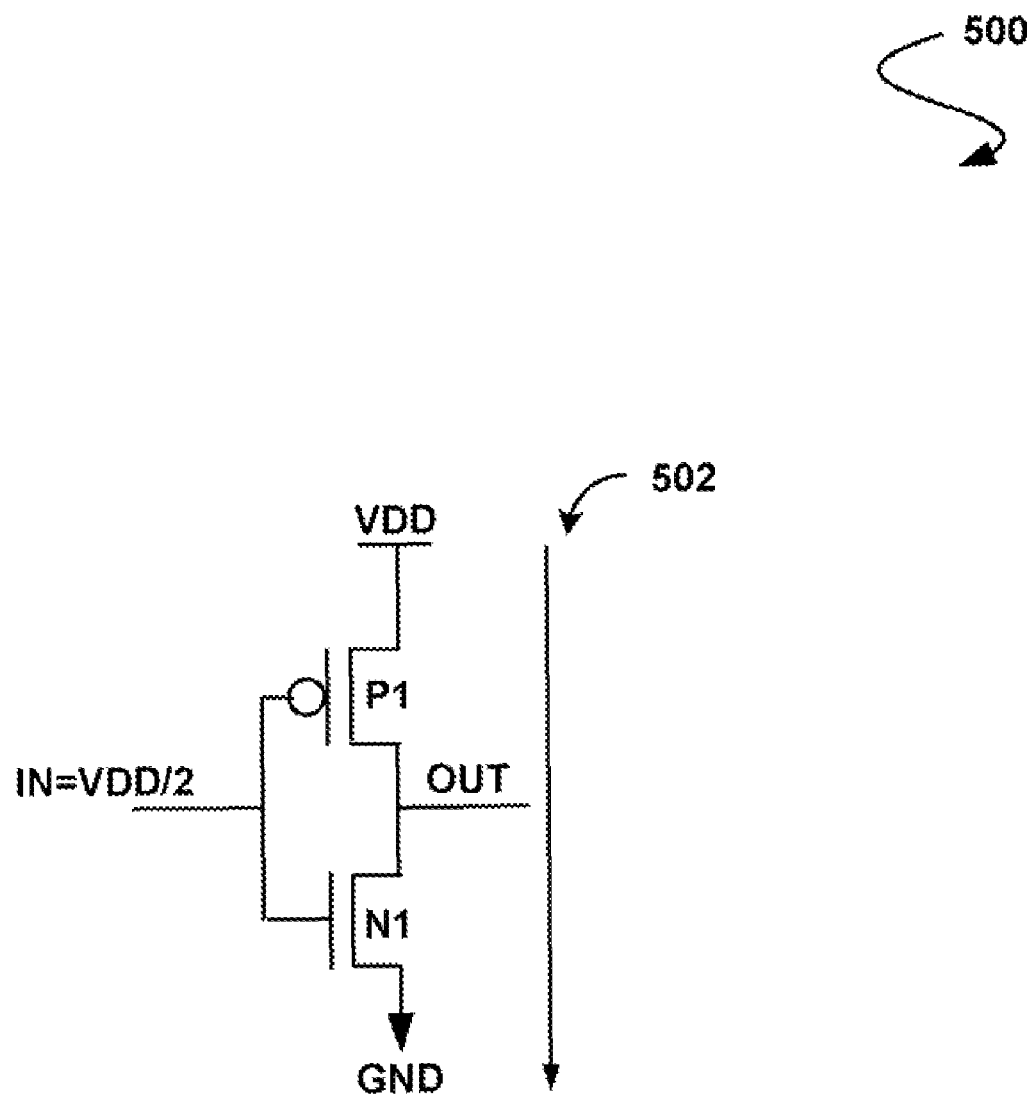
FIG. 5 shows an inverter that illustrates one problem with powering down a low voltage domain, in accordance with the prior art.
Figure 6:
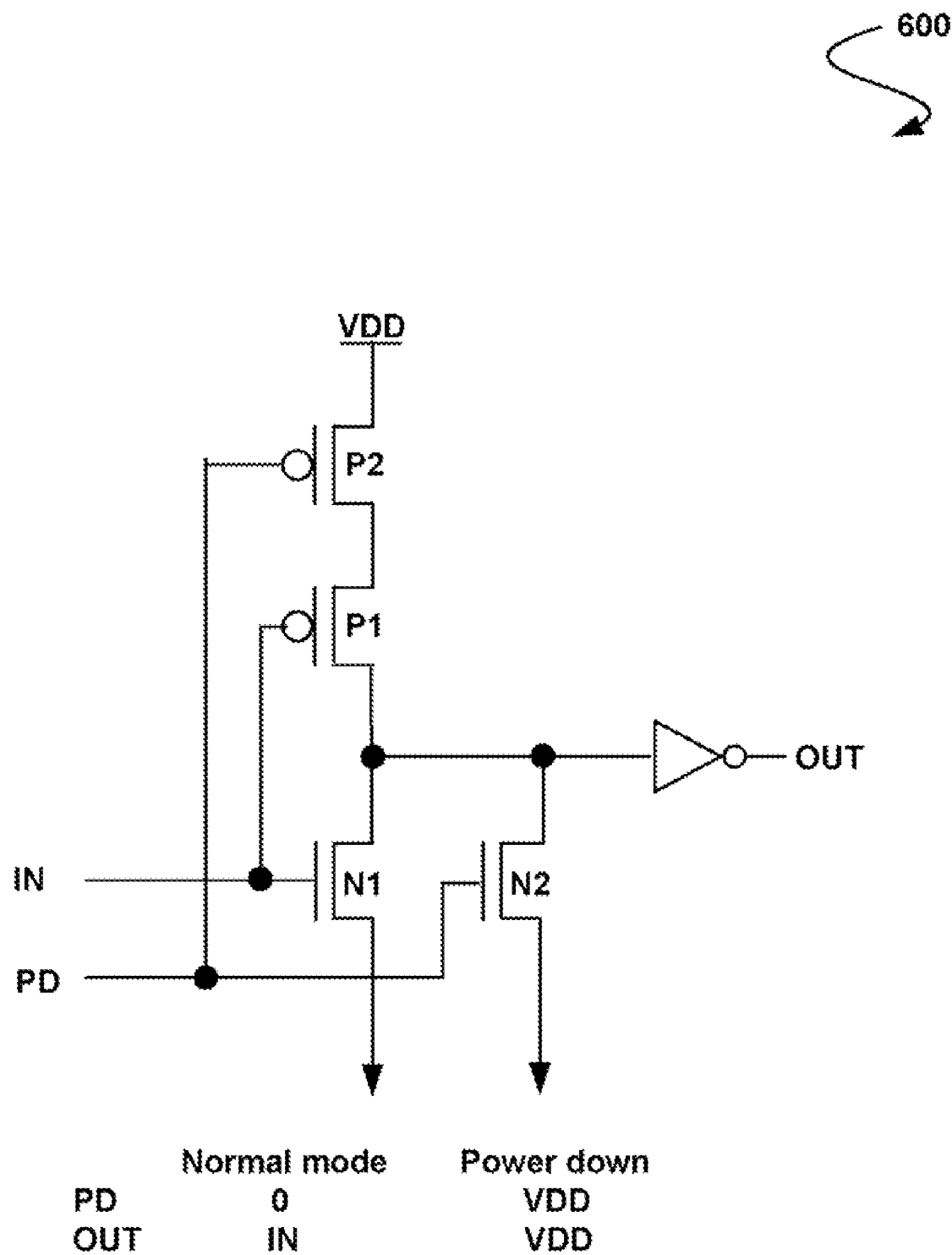
FIG. 6 shows a dual OR-gate that addresses the problem with powering down a low voltage domain, in accordance with the prior art.
Figure 7:
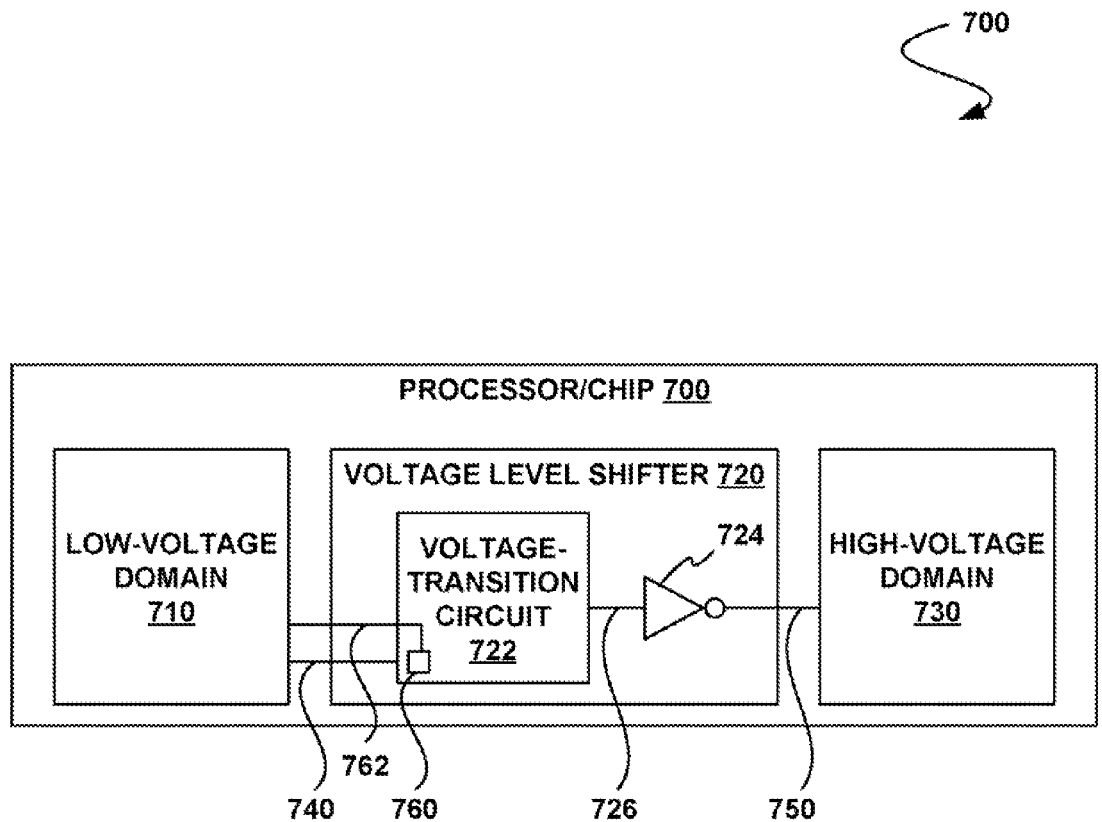
FIG. 7 is a schematic diagram of a processor/chip with a voltage level shifter configured to convert power supply voltages from a low voltage domain ("VDDL domain") to power supply voltages of a high voltage domain ("VDDH domain"), according to an embodiment.

FIG. 7 is a schematic diagram of a processor/chip 700 with a voltage level shifter 720 configured to convert power supply voltages from a low voltage domain ("VDDL domain") 710 to power supply voltages of a high voltage domain ("VDDH domain") 730, according to an embodiment. The power supply voltages of the VDDL domain can be referred to as "VDDL power supply voltages" and the power supply voltages of the VDDH domain can be referred to as "VDDH power supply voltages."

Specifically, the voltage level shifter 720 can be configured to convert VDDL to VDDH, and the ground voltage of the VDDL domain 730 ("low-domain ground voltage") to the ground voltage of the VDDH domain 710 ("high-domain ground voltage"). The voltage level shifter 720 converts the low-domain ground voltage to the high-domain ground voltage when in a first state and converts VDDL to VDDH when in a second state. Although the low-domain ground voltage and the high-domain ground voltage are a common ground voltage ("GND" or "ground") in this embodiment, in other embodiments, the low-domain ground voltage and the high-domain ground voltage can be different voltages.

In use, the voltage level shifter 720 can be triggered to change from the first state to the second state when the input voltage changes from ground to VDDL. Likewise, the voltage level shifter 720 can be triggered to change from the second state to the first state when the input voltage changes from VDDL to ground. Note that the designations of the first state and second state are arbitrary designations that do not imply an order.

The power supply voltages within the VDDL and VDDH domains can vary significantly depending on the application and the processing technology employed. An example of voltages for the VDDL and VDDH domains within a typical processing technology are VDDL of 0.8 V±10% and VDDH of 1V±10%. Exemplary threshold voltages for n-type transistors that correspond with these voltage domains can be between 200 mV to 350 mV and exemplary threshold voltages for p-type transistors for these voltage domains can be between −350 mV to −200 mV. The variation (e.g. ranges) in the voltage domains and threshold voltages can be caused by, for example, processing variation, temperature changes, etc.

As shown in FIG. 7, the voltage level shifter 720 has an input 740 configured to receive the VDDL power supply voltages from the VDDL domain 710. In one embodiment, the input 740 may include a single-rail input, but, of course, other embodiments are contemplated where additional rail inputs are contemplated.

The VDDL power supply voltages, when converted by the voltage level shifter 720 to the VDDH domain, can be output as VDDH power supply voltages on an output 750 of the voltage level shifter 720. Specifically, the VDDL power supply voltage received on the input 740 can be converted using a voltage-transition circuit 722 and an inverter 724 of the voltage level shifter 720. An output 726 of the voltage-transition circuit 722 is inverted when received on an input of the inverter 724. Although not shown in FIG. 7, the voltage level shifter 720 can be powered by power supply voltages such as VDDH and ground.

Although FIG. 7 shows that the processor/chip 700 has only a single voltage level shifter 720 converting a single low voltage domain 710 to a single high voltage domain 730, in some embodiments, the processor/chip 700 can be designed to include more than one voltage level shifter 720, low voltage domain 710, and/or high voltage domain 730. For example, multiple voltage level shifters of different types (e.g. different voltage shifting capability) can be used to convert voltages between different low voltage domains and/or high voltage domains.

With continuing reference to FIG. 7, the voltage level shifter 720 further includes a circuit component 760 for preventing current leakage or direct current when the VDDL domain 710 is powered down (e.g. in a power down mode, etc.). In the context of the present description, such current leakage or direct current prevention should be construed as partial or full prevention, such that current leakage is reduced, at least in part. By reducing the aforementioned current leakage in such manner, power savings may be afforded when the VDDL domain 710 is powered down. In one embodiment, this feature may be provided when the voltage level shifter 720 is in both an operation mode and a power down mode, as will become apparent.

As an option, such circuit component 760 may receive at least one power down input 762 for indicating whether the VDDL domain 710 is in a power down mode. In one possible embodiment, such power down input(s) 762 may be shared by a plurality of voltage level shifters 720 that are used in conjunction with the VDDL domain 710. For example, one embodiment is contemplated where the power down input(s) 762 is shared by all of the voltage level shifters 720 that, are used in conjunction with the VDDL domain 710. Further, when the VDDL domain 710 is powered down, a portion of VDDL power may be available for a power down signal, as will be set forth hereinafter in greater detail.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 8:
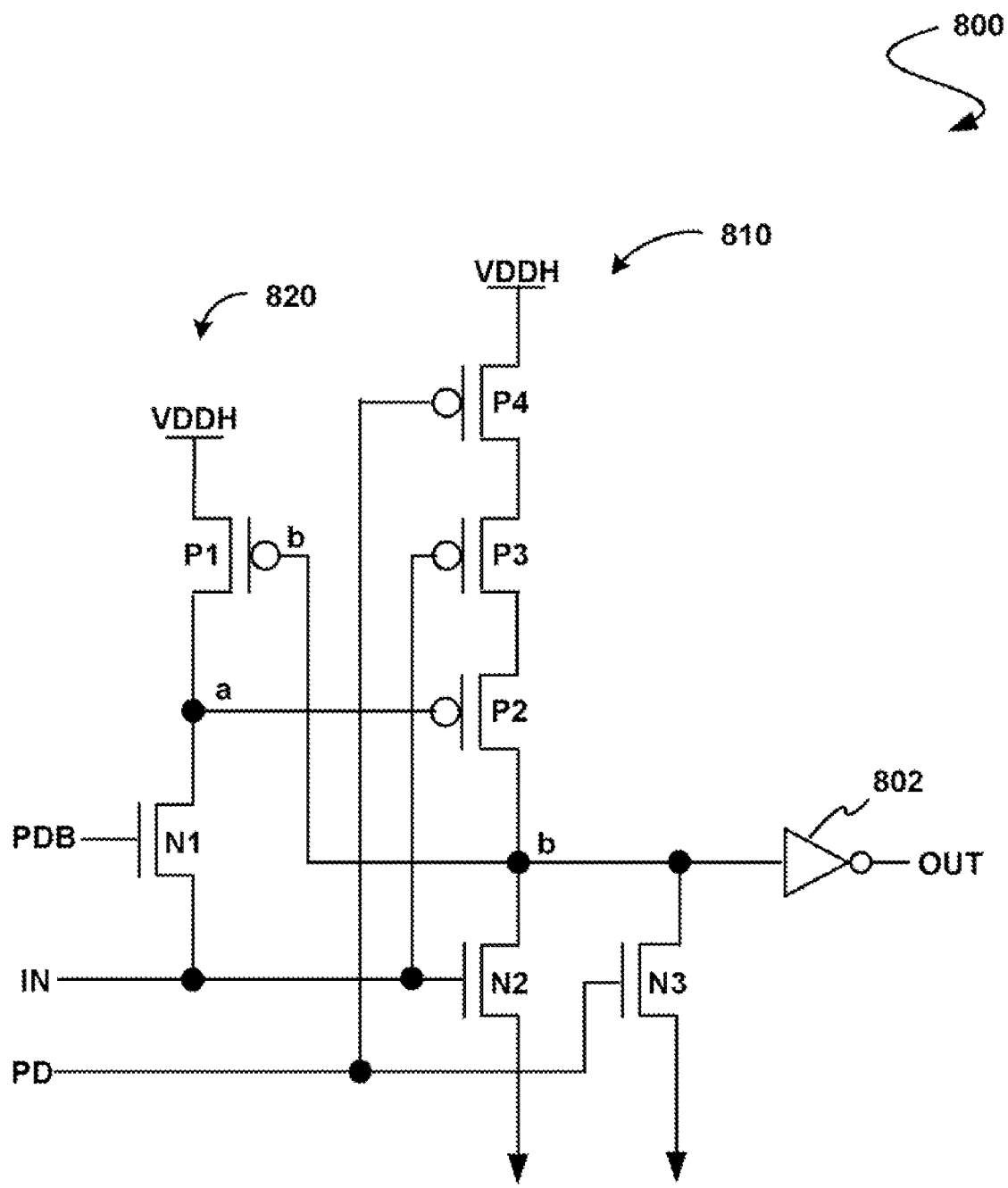
FIG. 8 shows a single-rail level shifter circuit for preventing a current leakage when a low voltage domain is powered down, in accordance with one embodiment.

FIG. 8 shows a single-rail level shifter circuit 800 for preventing current leakage when a low voltage domain is powered down, in accordance with one embodiment. As an option, the present level shifter circuit 800 may be implemented in the context of the processor/chip 700 of FIG. 7. Of course, however, the level shifter circuit 700 may be implemented in any desired environment. It should also be noted that the aforementioned definitions may apply during the present description.

As shown, the voltage level shifter 800 can be configured to convert VDDL power supply voltages of a VDDL domain to VDDH power supply voltages of a VDDH domain. The voltage level shifter 800 includes a voltage-transition circuit with an output contact point that can be connected to an input of an inverter 802. An output of the inverter can be an output of the voltage level shifter 800.

The voltage-transition circuit includes an input-rising-transition circuit 810 and an input-falling-transition circuit 820. In this embodiment, a single-rail input of the voltage transition circuit (which is also an input of the voltage level shifter 800) can be connected to the input-rising-transition circuit 810 and connected to the input-falling-transition circuit 820 in the manner shown.

The VDDL power supply voltages of the VDDL domain can be received on the single-rail input. The VDDL power supply voltages, when converted by the voltage level shifter 800 to the VDDH domain, can be output as VDDH power supply voltages on the output of the voltage level shifter 800. The single-rail input can be referred to as a single-rail-input node or input node and the output can be referred to as an output node.

The voltage-transition circuit of the voltage level shifter 800 can be configured to change from a first state to a second state, and vice versa, the single-rail input of the voltage level shifter 800 changes (e.g. from VDDL to the ground voltage). Specifically, the input-rising-transition circuit 810 of the voltage-transition circuit triggers the change from the first state to the second state when the single-rail input rises from ground to VDDL. The input-falling transition circuit 820 of the voltage-transition circuit triggers the change from the second state to the first state when the single-rail input falls from VDDL to ground.

As shown, the input-falling-transition circuit 820 includes an n-type transistor N1 with a drain connected to a drain of a p-type transistor P1 at a first contact point a. A source of the P1 transistor is connected to VDDH. The source of the N1 transistor is connected to the single-rail input IN and the gate of the N1 transistor is connected to an inverse power down input (PDB), instead of a VDDL reference voltage.

The input-rising-transition circuit 810 includes an n-type transistor N2 with a gate connected to the single-rail input IN and a source connected to a ground voltage (also can be referred to as a ground voltage node). The N2 transistor has a drain connected to the output contact point. The output contact point is connected to the gate of the P1 transistor as a feedback connection that can be referred to as an input-rising feedback connection.

A p-type transistor P2 has a drain connected to the output contact point and a gate connected to the contact point a of the input-falling-transition circuit 820. The input-rising-transition circuit 810 also has a third p-type transistor P3 connected in series with the P2 transistor. The P3 transistor has drain connected to a source of the second p-type transistor P2. Further, the P3 transistor has a gate connected to the single-rail input IN.

For providing power savings during a low voltage domain power down mode, further provided is a third n-type transistor N3 having a gate connected a power down input (PD). In use, PD and PDB may be the only signals from the VDDL domain that are not floating, during a power down operation.

The N3 transistor further has a source connected to the ground voltage and a drain connected to the output contact point. Still yet, a fourth p-type transistor P4 is provided having a gate connected the power down input PD, a source connected to the drain of the P3 transistor, and a drain connected to a VDDH voltage of the high voltage domain. In use, such circuit components are adapted for preventing a direct current when the low voltage domain is powered down.

The voltage level shifter 800 thus provides for two pins to accept a power down input signal and a power down input signal (which indicate that the low voltage domain is in a power down mode). The power down input PD receives the associated signal from the VDDL domain. Further, the inverse power down input PDB receives the inverted power down input signal from the VDDL domain. As shown, the gate of the N1 transistor is connected to the inverse power down input PDB. Still yet, the N3 and P4 transistors are connected to the power down input PD, in the manner illustrated.

In one embodiment, the power down input signal the power down input signal may not necessarily be timing critical and thus may be connected to hundreds of level shifters, or more. Thus, in one embodiment, assuming the presence of 1000 signals going from the VDDL domain to the VDDH domain, only 1002 (1000+2) need necessarily be routed. Table 1 illustrates various exemplary modes of operation associated with the voltage level shifter 800.

TABLE 1

|     | Normal mode | Power down mode |
| --- | --- | --- |
| PD  | 0 | VDDL |
| PDB | VDDL | 0 |
| IN  | 0/VDDL | X |
| OUT | 0/VDDH | VDDH |

As shown, in a normal mode of operation, PD=0 and PDB=VDDL. When IN=0, OUT=0. Further, when IN=VDDL, OUT=VDDH. While in the power down mode, PD=VDDL and PDB=0 (regardless the value of the input IN), OUT=VDDH.

Figure 9A:
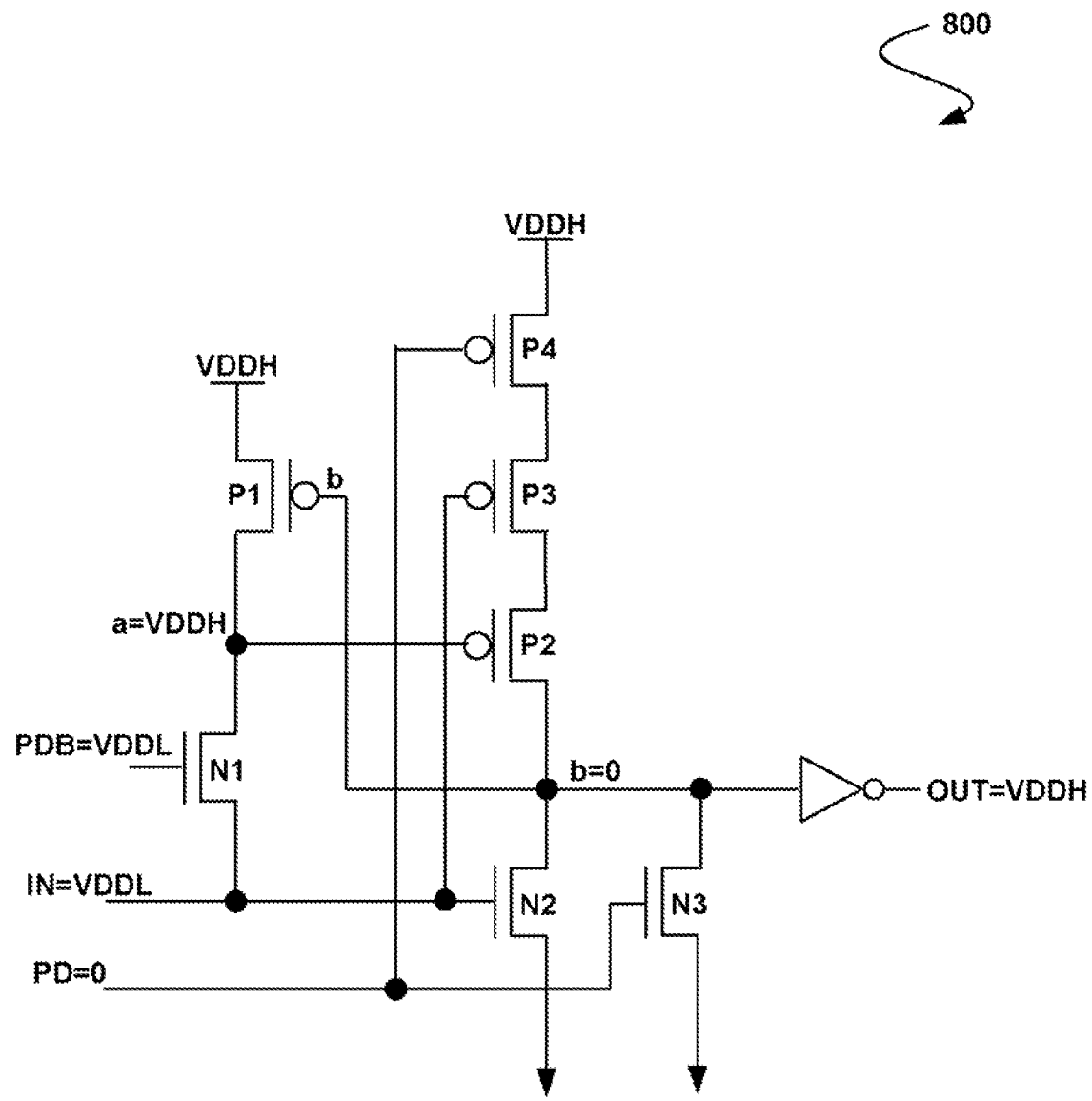
FIGS. 9A-9C illustrate the single-rail level shifter circuit of FIG. 8 in the context of different modes and with different input/output combinations.
Figure 9B:
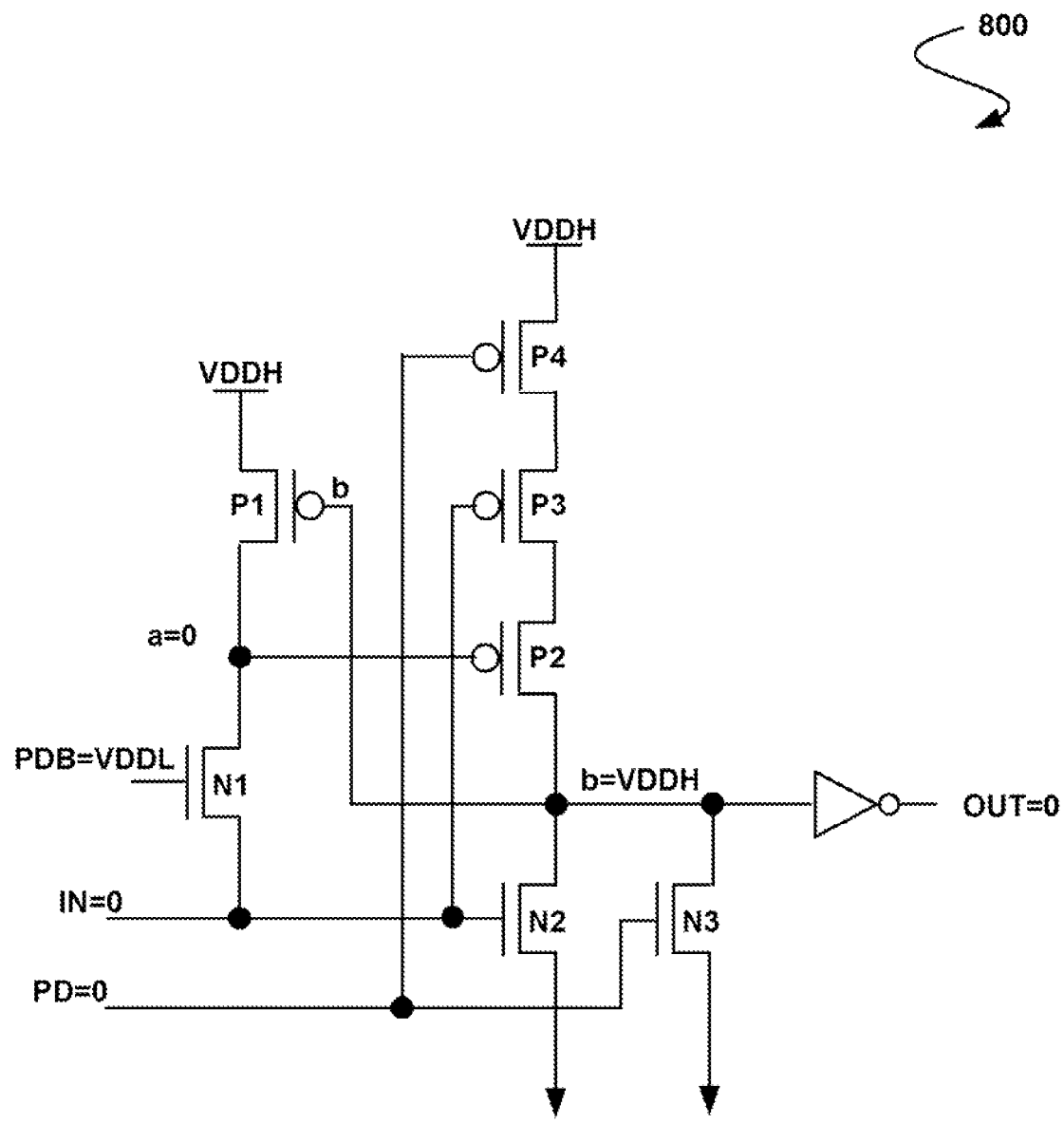
Figure 9C:
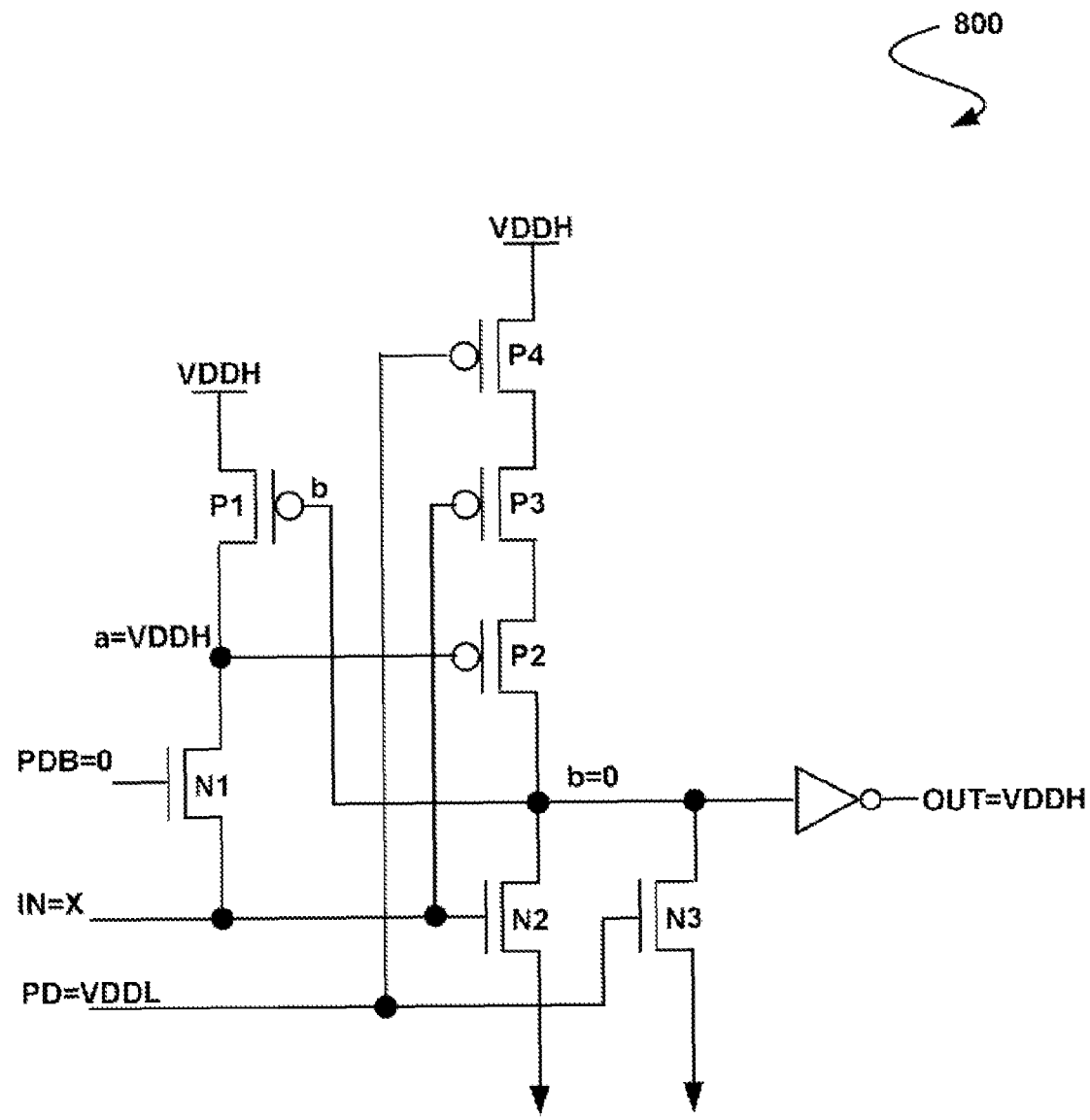

FIGS. 9A-9C illustrate the single-rail level shifter circuit 800 of FIG. 8 in the context of different modes and with different input/output combinations. With reference to FIG. 9A, the level shifter is shown to be in a normal mode, with PD=0 and PDB=VDDL. The inverse power down input PDB acts as in place of a VDDL reference voltage. Further, the N3 transistor is deactivated and the P4 transistor is activated.

Further shown is the fact that IN=VDDL, the N2 transistors is activated, contact point b=0, and OUT=VDDH.

In use during such mode operation, the P3 transistor is partially activated or fully activated depending on a value of VDDL, VDDH and a threshold voltage of the P3 transistor. The size of the N2 transistor may guarantee that the contact point b can be pulled down to 0, even if the P3 transistor is fully activated. The P2 and P1 transistors are used to cut off DC current that would otherwise flow through the P3 and N2 transistors which are both activated. Since b=0, the P1 transistor is activated and pulls up contact point a to VDDH. The source and gate of the P2 transistor are both VDDH, thus the P2 transistors is deactivated and there is no DC current flowing from VDDH to ground. Further, the drain of the N1 transistor is VDDH and the gate and the source of the N1 transistor are both VDDL, such that the N1 transistor is deactivated.

With reference now to FIG. 9B, the level shifter is shown to operate in the normal mode, with PD=0 and PDB=VDDL. The inverse power down input PDB acts as a VDDL reference voltage. Further, the N3 transistor is deactivated and the P4 transistor is activated.

As shown, IN=0, the N2 transistor is deactivated and the P3 transistor is activated. Further, the N1 transistor is activated and pulls down contact point a from VDDH to 0. In one embodiment where the P1 transistor is a weak pull-up device, a size of the N1 transistor may be set to guarantee that the N1 transistor can pull contact point a to 0 when the P1 transistor is activated. After contact point a has been pulled down to 0, the P2 transistor is activated. Further, the P2 and P3 transistors may serve to pull contact point b to VDDH, and the P1 transistor may be turned off and the output may be 0. By this design, there is no DC current flowing through VDDH.

Turning now to FIG. 9C, the level shifter is shown to operate in a power down mode, with PD=VDDL and PDB=0. Since PDB=0, the N1 transistor is deactivated. Further, the input IN may be any value from 0 to VDDL. As shown, PD=VDDL, the N3 transistor is activated, contact point b=0, and OUT=VDDH. In use, the P4 transistor is partially or fully activated, depending on a value of VDDL, VDDH and a threshold voltage of the P4 transistor.

A size of the N3 transistor may guarantee that contact point b can be pulled down to 0 even if the P4, P2, and P3 transistors are fully activated. The P2 and P1 transistors are used to cut off the DC current that would otherwise flow through the P4, P2, P3, and N3 transistors. The P4 and N3 transistors are both activated, and the P3 transistors can be activated depending on a value of the input IN. Since b=0, the P1 transistor is activated and pulls up contact point a to VDDH. The source and gate of the P2 transistor are both VDDH, so the P2 transistor is deactivated such that there is no DC current flowing through VDDH to ground.

Figure 10:
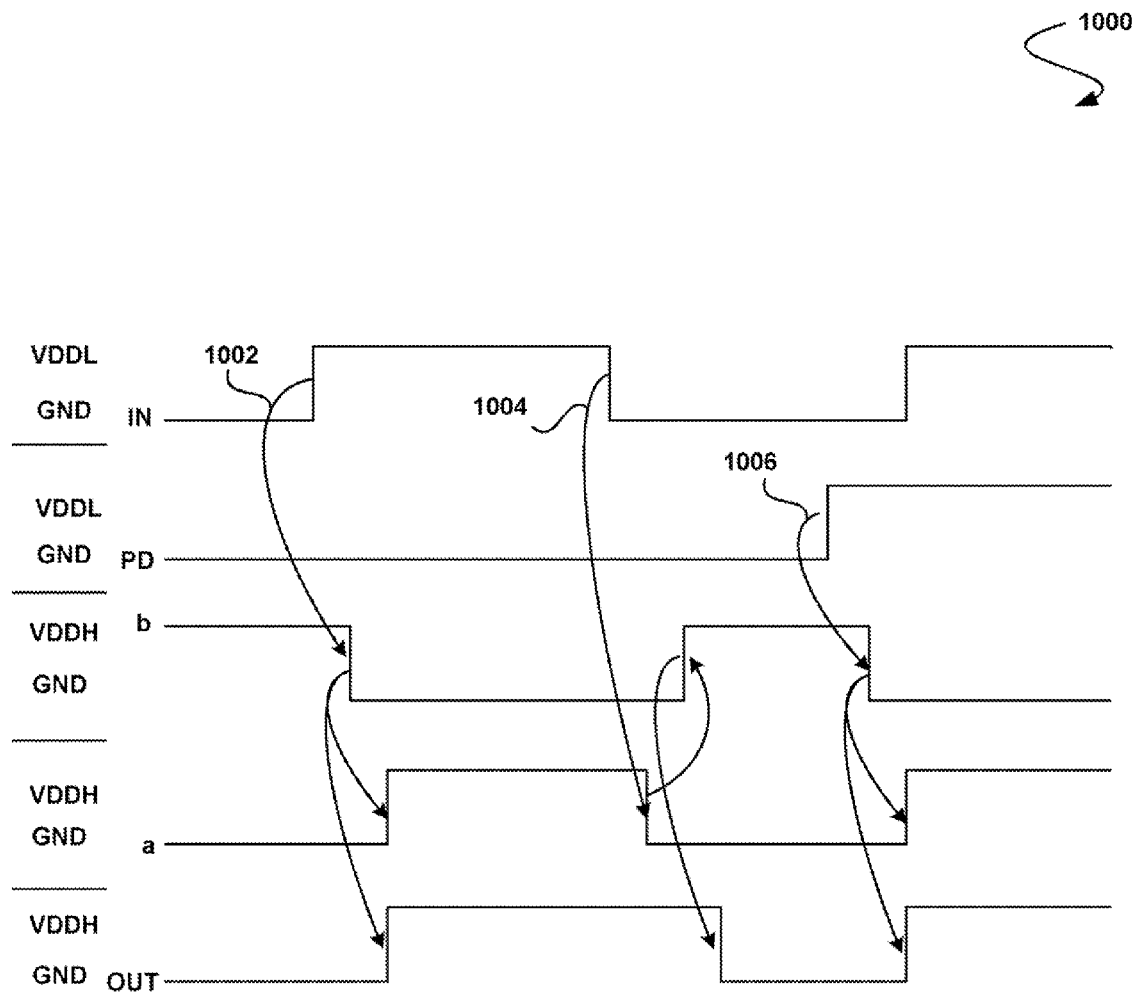
FIG. 10 is a signal diagram showing operation of a level shifter circuit for preventing a current leakage when a low voltage domain is powered down, in accordance with one embodiment.

FIG. 10 is a signal diagram 1000 showing operation of a level shifter circuit for preventing current leakage when a low voltage domain is powered down, in accordance with one embodiment. As an option, the signal diagram 1000 may reflect an operation of the single-rail level shifter circuit 800 of FIG. 8. It should also be noted that the aforementioned definitions may apply during the present description.

As shown, the transitions 1002 correlate with a level shifter circuit in a normal mode of operation with IN=VDDL. See FIG. 9A, and the accompanying description. As shown, the transition of contact point a to a high state activates the appropriate transistor(s) to prevent current leakage in an input-rising transition circuit. The transitions 1004, on the other hand, correlate with a level shifter circuit in a normal mode of operation with IN=0. See FIG. 9B, and the accompanying description. As shown, the transitions of nodes and b prevent current leakage in an input-falling transition circuit. The transitions 1006, finally, correlate with a level shifter circuit in a power down mode of operation. See FIG. 9C, and the accompanying description. As shown, the transition of contact point a to a high state deactivates the appropriate transistor(s) (e.g. P2 transistor) and thus serves to prevent current leakage in an input-failing transition circuit.

Figure 11:
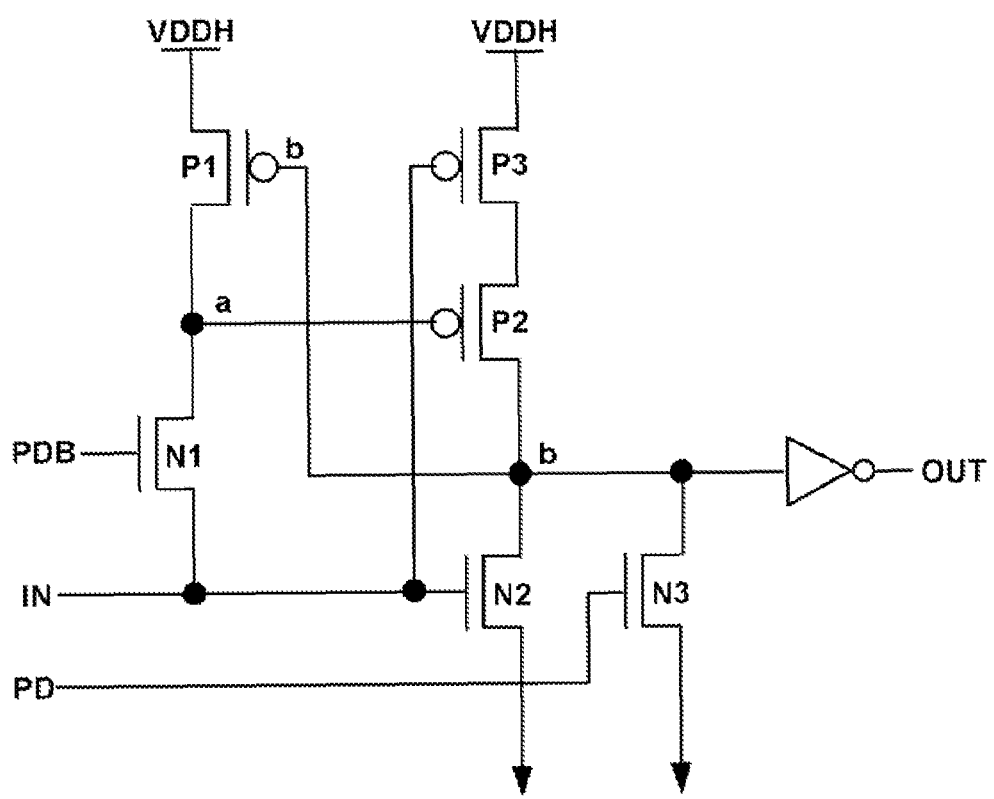
FIGS. 11-12 show different single-rail level shifter circuits for preventing current leakage when a low voltage domain is powered down, in accordance with one embodiment.
Figure 12:
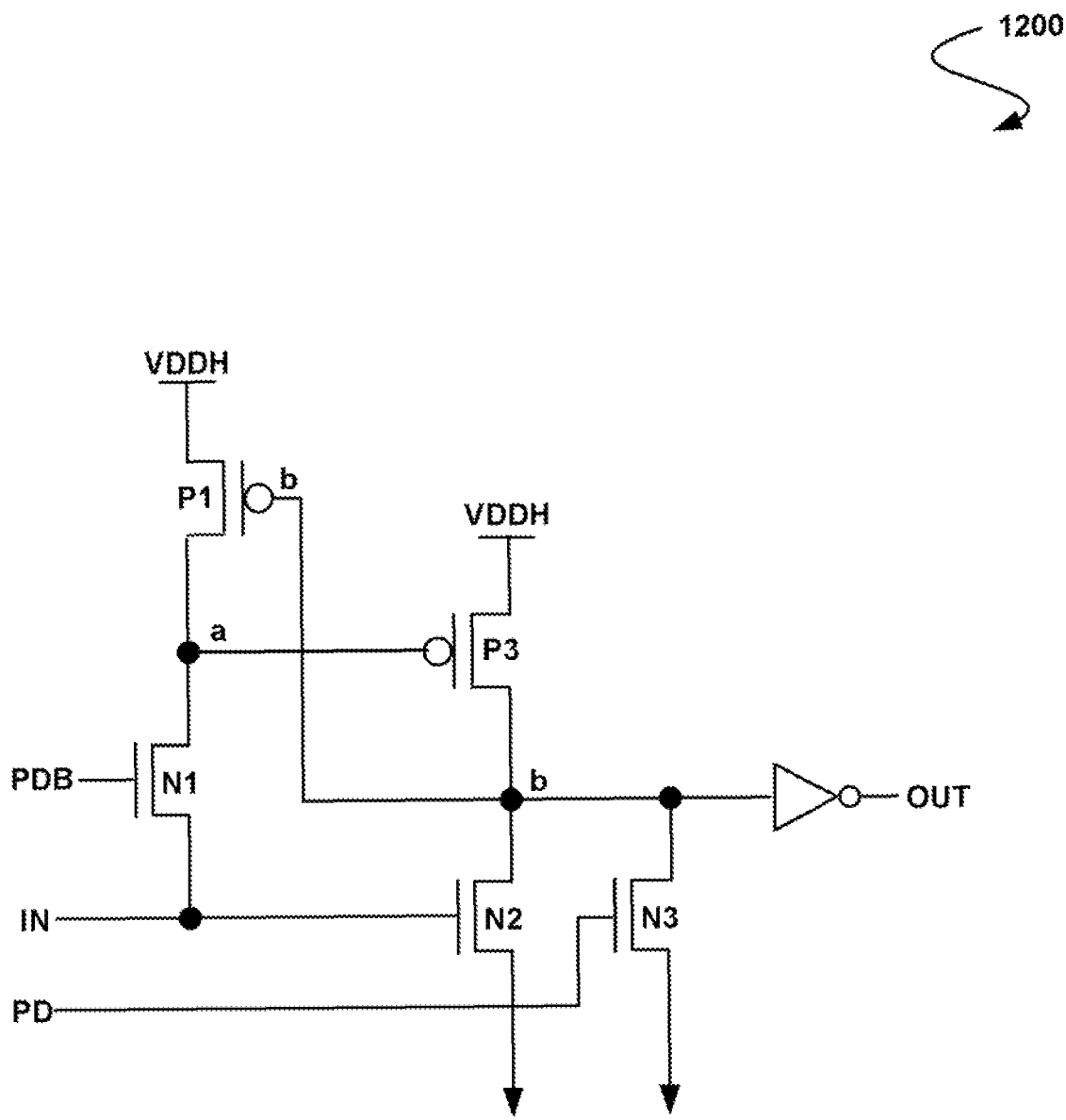

FIGS. 11-12 show different single-rail level shifter circuits 1100, 1200 for preventing current leakage when a low voltage domain is powered down, in accordance with one embodiment. As an option, the present level shifter circuits 1100, 1200 may be implemented in the context of the processor/chip 700 of FIG. 7. Of course, however, the level shifter circuits 1100, 1200 may be implemented in any desired environment. Yet again, it should also be noted that the aforementioned definitions may apply during the present description.

In FIG. 11, the P4 transistor of the level shifter circuit 800 of FIG. 8 is removed. In this case, the N3 transistor may be upsized to balance the P2 and P3 transistors. It is also possible that both of the P2 and P3 transistors may be activated before entering the power down mode. In FIG. 12, the P4 and P2 transistors of the level shifter circuit 800 of FIG. 8 are removed. In this case, both the N2 and N3 transistors may be upsized to counter the P3 transistor, in either normal mode or power down mode, the P3 transistor may be activated before the N2 and N3 transistors are activated to discharge contact point b.

In any case, lower power consumption may be afforded, since there is a reduced (if not an elimination of) DC current path in the circuit. Further, a number of signals to be routed may be reduced (e.g. halved) compared with widely used dual-rail inputs level shifters. Still yet, power down control may ensure that no DC current remains in the circuit when the input is floating.

Figure 13:
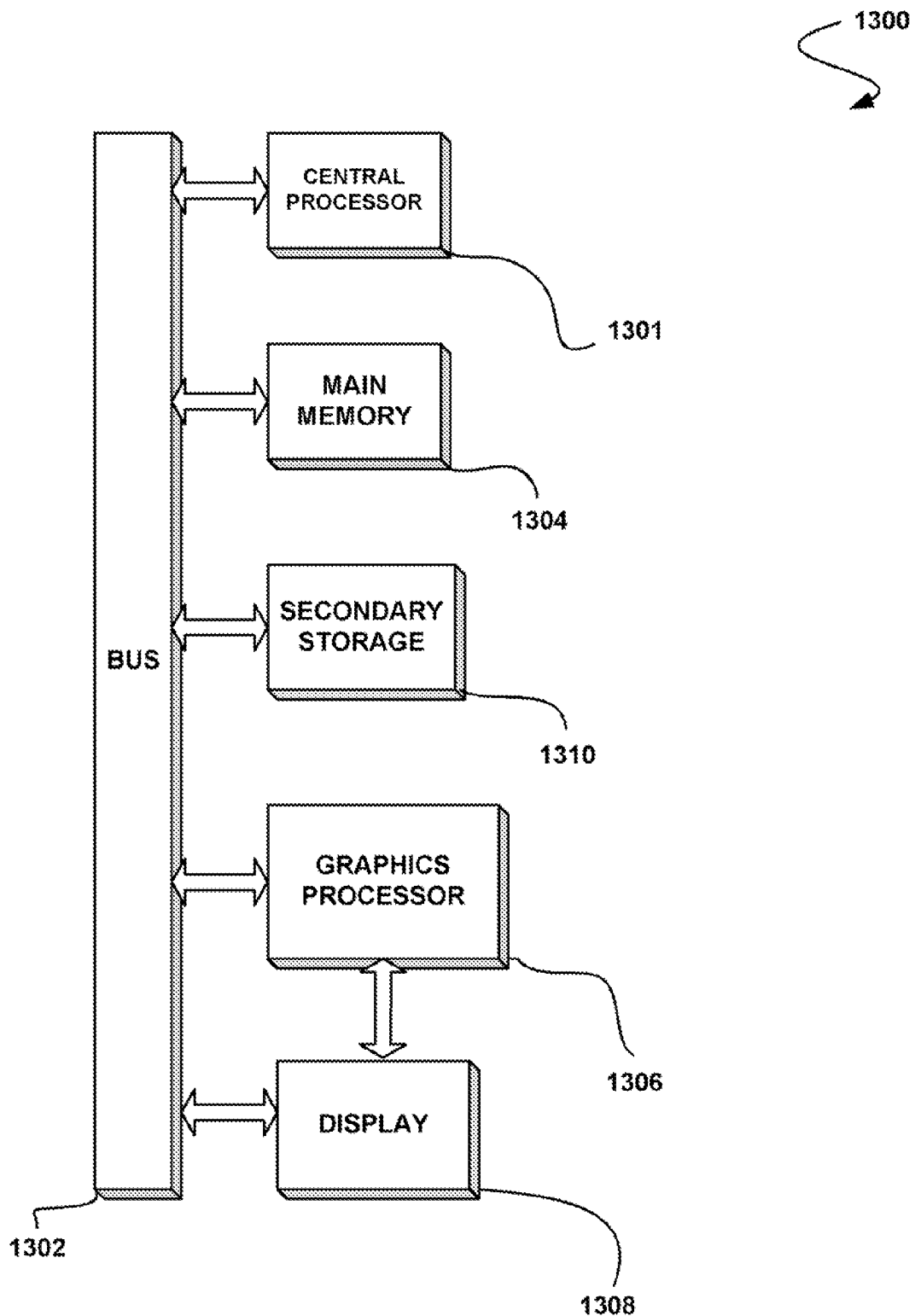
FIG. 13 illustrates an exemplary system in which the various architecture and/or functionality of the various previous embodiments may be implemented.

FIG. 13 illustrates an exemplary system 1300 in which the various architecture and/or functionality of the various previous embodiments may be implemented. As shown, a system 1300 is provided including at least one host processor 1301 which is connected to a communication bus 1302. The system 1300 also includes a main memory 1304. Control logic (software) and data are stored in the main memory 1304 which may take the form of random access memory (RAM).

The system 1300 also includes a graphics processor 1306 and a display 1308, i.e. a computer monitor. In one embodiment, the graphics processor 1306 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1300 may also include a secondary storage 1310. The secondary storage 1310 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 1304 and/or the secondary storage 1310. Such computer programs, when executed, enable the system 1300 to perform various functions. Memory 1304, storage 1310 and/or any other storage are possible examples of computer-readable media.

In one embodiment the circuitry and/or functionality of the various previous figures may be implemented in the context of the host processor 1301, graphics processor 1306, an integrated circuit (not shown) that is capable of at least a portion of the capabilities of both the host processor 1301 and the graphics processor 1306, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1300 may take the form of a desktop computer, lap-top computer, and/or any other type of logic. Still yet, the system 1300 may take the form of various other devices m including, but not limited to a personal digital assistant (PDA) device, a mobile phone device, a television, etc.

Further, while not shown, the system 1300 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
a voltage transition circuit connected between a low voltage domain and a high voltage domain, the voltage transition circuit including a circuit component for preventing a current leakage or direct current when the low voltage domain is powered down;
wherein the voltage transition circuit includes an input-falling-transition circuit, the input-falling-transition circuit comprising:
a p-type transistor; and
an n-type transistor having a drain connected to a drain of the p-type transistor at a contact point, a source connected to a single-rail input, the p-type transistor having a source connected to a VDDH voltage of the high voltage domain;
wherein the n-type transistor has a gate connected to a power down input.

2. The apparatus of claim 1, wherein the low voltage domain and the high voltage domain are components of a processor.

3. The apparatus of claim 2, wherein the processor includes a graphics processor.

4. The apparatus of claim 1, wherein the low voltage domain is connected to the single-rail input.

5. The apparatus of claim 4, wherein the voltage transition circuit is connected to the single-rail input to convert a voltage of the low voltage domain received via the single-rail input to a voltage of the high voltage domain.

6. The apparatus of claim 1, wherein the voltage transition circuit includes an input-rising-transition circuit, the input-rising-transition circuit comprising:
a second n-type transistor having a gate connected to the single-rail input, the second n-type transistor having a source connected to a ground voltage, and a drain connected to an output contact point, the output contact point being connected to a gate of the p-type transistor of the input-falling-transition circuit; and
a second p-type transistor having a drain connected to the output contact point and a gate connected to the contact point of the input-falling-transition circuit.

7. An apparatus, comprising:
a voltage transition circuit connected between a low voltage domain and a high voltage domain, the voltage transition circuit including a circuit component for preventing a current leakage or direct current when the low voltage domain is powered down;
wherein the voltage transition circuit includes an input-rising-transition circuit, the input-rising-transition circuit comprising:
a first n-type transistor having a gate connected to a single-rail input, the first n-type transistor having a source connected to a ground voltage, and a drain connected to an output contact point, the output contact point being connected to a gate of a first p-type transistor of an input-falling-transition circuit; and
a second p-type transistor having a drain connected to the output contact point and a gate connected to a contact point of the input-falling-transition circuit;
wherein the input-rising-transition circuit has a third p-type transistor connected in series with the second p-type transistor, the third p-type transistor having a drain connected to a source of the second p-type transistor and a gate connected to the single-rail input.

8. The apparatus of claim 7, wherein the circuit component comprises:
a second n-type transistor having a gate connected to a power down input, a source connected to the ground voltage, and a drain connected to the output contact point.

9. The apparatus of claim 7, wherein the circuit component comprises:
a fourth p-type transistor having a gate connected to a power down input, a source connected to the drain of the third p-type transistor, and a drain connected to a VDDH voltage of the high voltage domain.

10. The apparatus of claim 6, wherein the output contact includes an inverter.

11. The apparatus of claim 1, wherein the circuit component is adapted for preventing the direct current when the low voltage domain is powered down.

12. The apparatus of claim 1, wherein the voltage transition circuit is a component of a processor coupled to memory via a bus.

13. A method, comprising:
receiving at a voltage transition circuit a power supply voltage from a low voltage domain;
converting the power supply voltage from the low voltage domain to a high voltage domain; and
preventing a current leakage or direct current when the low voltage domain is powered down;
wherein the voltage transition circuit includes an input-falling-transition circuit, the input-falling-transition circuit comprising:

a p-type transistor; and an n-type transistor having a drain connected to a drain of the p-type transistor at a contact point, a source connected to a single-rail input, the p-type transistor having a source connected to a VDDH voltage of the high voltage domains;

wherein the n-type transistor has a gate connected to a power down input.

14. The method of claim 13, wherein the low voltage domain and the high voltage domain are components of a processor.

15. The method of claim 14, wherein the processor includes a graphics processor.

16. The method of claim 13, wherein the low voltage domain is connected to the single-rail input.

17. The method of claim 16, wherein the voltage transition circuit is connected to the single-rail input to convert a voltage of the low voltage domain received via the single-rail input to a voltage of the high voltage domain.

18. A system, comprising:

means for receiving at a voltage transition circuit a power supply voltage from a low voltage domain;

means for converting the power supply voltage from the low voltage domain to a high voltage domain; and means for preventing a current leakage or direct current when the low voltage domain is powered down;

wherein the voltage transition circuit includes an input-falling-transition circuit, the input-falling-transition circuit comprising:

a p-type transistor; and an n-type transistor having a drain connected to a drain of the p-type transistor at a contact point, a source connected to a single-rail input, the p-type transistor having a source connected to a VDDH voltage of the high voltage domains;

wherein the n-type transistor has a gate connected to a power down input.

* * * * *

UNITED STATES PATENT AND TRADEMARK OFFICE
CERTIFICATE OF CORRECTION

| | | |
|---|---|---|
| PATENT NO. | : 7,583,126 B2 | |
| APPLICATION NO. | : 11/753501 | |
| DATED | : September 1, 2009 | |
| INVENTOR(S) | : Yang et al. | |

It is certified that error appears in the above-identified patent and that said Letters Patent is hereby corrected as shown below:

Col. 7, line 37, please replace "As shown." with -- As shown, --;
Col. 8, line 8, please replace "input-failing" with -- input-falling --;
Col. 8, line 25, please replace "transistor, in" with -- transistor. In --.

Col. 11, line 6, please replace "domains" with -- domain --.

Signed and Sealed this
Seventeenth Day of May, 2011

David J. Kappos
*Director of the United States Patent and Trademark Office*